(12) United States Patent
Mäkelä et al.

(10) Patent No.: US 7,016,785 B2
(45) Date of Patent: Mar. 21, 2006

(54) LIGHTNING DETECTION

(75) Inventors: Jakke Mäkelä, Turku (FI); Terho Kaikuranta, Piispanristi (FI); Pekka Naula, Piispanristi (FI)

(73) Assignee: Nokia Corporation, Espoo (FI)

( * ) Notice: Subject to any disclaimer, the term of this patent is extended or adjusted under 35 U.S.C. 154(b) by 85 days.

(21) Appl. No.: 10/794,413

(22) Filed: Mar. 4, 2004

(65) Prior Publication Data
US 2005/0197776 A1 Sep. 8, 2005

(51) Int. Cl.
*G06F 19/00* (2006.01)
*G01W 1/00* (2006.01)

(52) U.S. Cl. .......................................... 702/4

(58) Field of Classification Search ............ 702/4, 702/3; 340/460, 601, 945; 73/170.24; 324/72
See application file for complete search history.

(56) References Cited

U.S. PATENT DOCUMENTS

| | | | |
|---|---|---|---|
| 3,891,919 A * | 6/1975 | Penninger ................ | 324/72 |
| 4,198,599 A | 4/1980 | Krider et al. | |
| 4,272,720 A | 6/1981 | Lennon | |
| 4,506,211 A | 3/1985 | Coleman et al. | |
| 4,543,580 A | 9/1985 | Bent et al. | |
| 5,168,212 A | 12/1992 | Byerley et al. | |
| 5,263,368 A * | 11/1993 | Breitmeier et al. ...... | 73/170.24 |
| 5,541,501 A | 7/1996 | Shaver et al. | |
| 5,545,975 A * | 8/1996 | Youngquist ................ | 324/72 |
| 5,771,020 A * | 6/1998 | Markson et al. ........... | 342/460 |
| 5,959,815 A | 9/1999 | Gilbert | |
| 5,977,762 A * | 11/1999 | Murtha et al. .............. | 324/72 |
| 6,076,044 A | 6/2000 | Brown | |
| 6,215,294 B1 * | 4/2001 | Coleman ................. | 324/72 |
| 6,219,544 B1 * | 4/2001 | Suutarinen ............... | 455/423 |
| 6,232,882 B1 * | 5/2001 | Hed et al. ................ | 340/601 |
| 6,246,367 B1 * | 6/2001 | Markson et al. ........... | 342/460 |
| 6,420,862 B1 | 7/2002 | Medelius et al. | |
| 6,552,521 B1 * | 4/2003 | Medelius et al. ........... | 324/72 |
| 6,735,525 B1 * | 5/2004 | Murphy ...................... | 702/4 |
| 6,788,043 B1 * | 9/2004 | Murphy et al. ............. | 324/72 |
| 6,791,311 B1 * | 9/2004 | Murphy et al. ............. | 324/72 |
| 2002/0026284 A1 | 2/2002 | Brown | |

FOREIGN PATENT DOCUMENTS

EP 0186402 7/1986

(Continued)

OTHER PUBLICATIONS

"Lightning Acoustic Signature;" P.Depasse; Journal of Geophysical Research, vol. 99, No. D12, pp. 25,933-25,940, Dec. 20, 1994.

(Continued)

Primary Examiner—Donald McElheny, Jr.
(74) Attorney, Agent, or Firm—Alfred A. Fressola; Ware, Fressola, Van Der Sluys & Adolphson LLP

(57) ABSTRACT

A mobile radio-frequency enabled device that provides a reliable and inexpensive lightning alerting of a user. The device comprises an electromagnetic interferences detection component detecting electromagnetic interferences in radio-frequency signals received by the mobile radio-frequency enabled device for a communication link. The device further comprises a processing component to determine whether a lightning stroke can be assumed to have occurred in the vicinity of the device due to an electromagnetic interference detected by the electromagnetic interferences detection component, and to cause a notification of a user about an assumed lightning stroke via a user interface. The invention relates equally to a system which comprises such a device and a network element of a communication network, to a corresponding method and to a corresponding software program product.

22 Claims, 11 Drawing Sheets

FOREIGN PATENT DOCUMENTS

JP          11202056          7/1999

OTHER PUBLICATIONS www.vaisala.com; Vaisala; retrieved from the Interner Aug. 29, 2005.

www.spectrumthunderbolt.com; ThunderBolt Storm and Lightning Safety; retrieved from Internet Aug. 29, 2005.

www.safetyproductsunlimited.com/lightning; ThunderBolt Storm and Lightning detection; retrieved from Internet Aug. 29, 2005.

www.weathershop.com/strikealert; Strike Alert Personal Lightning Detector; retrieved from Internet Aug. 29, 2005.

www.geocites.com; Educational Links; retrieved from Internet Aug. 29, 2005.

www.met.tamu.edu/personnel/students/asilver; Lightning strikes statistics from USA; Jan.-Dec. 1992; retrieved from Internet Aug. 29, 2005.

\* cited by examiner

Monthly table (scale 0 to 5, 5 is highest risk)

|    | J | F | M | A | M | J | J | A | S | O | N | D |
|----|---|---|---|---|---|---|---|---|---|---|---|---|
| FL | 4 | 3 | 3 | 2 | 1 | 2 | 3 | 5 | 5 | 1 | 2 | 2 |
| TX | 2 | 4 | 4 | 4 | 5 | 5 | 3 | 2 | 2 | 2 | 3 | 4 |
| NM | 0 | 0 | 1 | 2 | 4 | 4 | 2 | 2 | 1 | 0 | 0 | 0 |
| TN | 0 | 0 | 2 | 2 | 2 | 2 | 2 | 1 | 1 | 1 | 1 | 0 |

Hourlytable (scale 0 to 5, 5 is highest risk)

|                    | 00 | 02 | 04 | 06 | 08 | 10 | 12 | 14 | 16 | 18 | 20 | 22 |
|--------------------|----|----|----|----|----|----|----|----|----|----|----|----|
| Midwest, summer    | 1  | 0  | 1  | 1  | 1  | 2  | 3  | 4  | 5  | 5  | 3  | 2  |
| Midwest, winter    | 0  | 0  | 1  | 1  | 1  | 1  | 1  | 2  | 2  | 1  | 0  | 0  |
| Caribbean, summer  | 2  | 2  | 2  | 2  | 2  | 2  | 4  | 4  | 4  | 4  | 4  | 3  |
| Caribbean, winter  | 2  | 2  | 2  | 2  | 2  | 3  | 3  | 3  | 3  | 3  | 3  | 3  |

Fig. 3

Monthly table (scale 0 to 5, 5 being the highest risk)

|         | J | F | M | A | M | J | J | A | S | O | N | D |
|---------|---|---|---|---|---|---|---|---|---|---|---|---|
| 090W30N | 4 | 3 | 3 | 2 | 1 | 2 | 3 | 5 | 5 | 1 | 2 | 2 |
| 110W20N | 2 | 4 | 4 | 4 | 5 | 5 | 3 | 2 | 2 | 2 | 3 | 4 |
| 120W30N | 0 | 0 | 1 | 2 | 4 | 4 | 2 | 2 | 1 | 0 | 0 | 0 |
| 130W30N | 0 | 0 | 2 | 2 | 2 | 2 | 2 | 1 | 1 | 1 | 1 | 0 |

Hourly table (scale 0 to 5, 5 being the highest risk)

|                            | 00 | 02 | 04 | 06 | 08 | 10 | 12 | 14 | 16 | 18 | 20 | 22 |
|----------------------------|----|----|----|----|----|----|----|----|----|----|----|----|
| 090W30N-120W50N, summer    | 1  | 0  | 1  | 1  | 1  | 2  | 3  | 4  | 5  | 5  | 3  | 2  |
| 090W30N-120W50N, summer    | 0  | 0  | 1  | 1  | 1  | 1  | 1  | 2  | 2  | 1  | 0  | 0  |
| 060W10N-100W30N, summer    | 2  | 2  | 2  | 2  | 2  | 2  | 4  | 4  | 4  | 4  | 4  | 3  |
| 060W10N-100W30N, summer    | 2  | 2  | 2  | 2  | 2  | 3  | 3  | 3  | 3  | 3  | 3  | 3  |

Fig. 4

Hourly risk

|   | N | L | A | H | V | E |
|---|---|---|---|---|---|---|
| N | N | N | L | L | A | A |
| L | N | L | L | A | H | H |
| A | L | A | H | H | V | V |
| H | A | A | H | H | V | E |
| V | H | H | V | E | E | E |
| E | V | E | E | E | E | E |

Monthly risk

Fig. 6

LIGHTNING DETECTION

FIELD OF THE INVENTION

The invention relates to a mobile radio-frequency enabled device and to a method of detecting a lightning stroke in such a mobile radio-frequency enabled device. The invention relates equally to a software program product for such a mobile radio-frequency enabled device and to a system comprising such a mobile radio-frequency enabled device.

BACKGROUND OF THE INVENTION

Thunderstorms are a major weather hazard, but are difficult to predict. They can travel at speeds of 20 km/h to 40 km/h, and lightning strokes may occur more than 10 km in front of the rain clouds and equally some distance behind the rain clouds. While a lightning stroke is produced by a cloud or a weather front, many of the most dangerous lightning strokes actually occur when no visible clouds are present above as a warning of a thunderstorm. Thus, a system that warns of possibly harmful thunderstorms, even if only approximately ten minutes before they become visible, can be considered a major safety feature.

There is a large population that would benefit from such a safety feature. To some persons, it might provide only a nice-to-know everyday knowledge. To a considerable number of persons, however, storm and lightning originated threats have significant implications in the form of an increased risk, loss of property or even fatal consequences. A lightning alerting system is of particular interest, for instance, for persons spending much time outdoors, and equally for aviators, navigators or the like. A system providing a warning of lightning even when the weather seems to be perfectly calm and clear may enable a person to take suitable safety measures in time, for instance seek shelter etc.

From the state of the art, many single-purpose lightning detectors are known, but they have some disadvantages from a commercial perspective.

Scientific lightning detectors, which are used in meteorology, are very large and their range is hundreds of kilometers.

Also other high-end lightning detectors using a single radio frequency (RF) band are large and relatively expensive, compared for instance to mobile phones. Moreover, they are usually required to have a specific orientation, for instance standing on a wall or on a desk stand, in order to gain the required accuracy or directionality. They are thus not well suited for a truly mobile use. These devices typically have further to be vertically positioned and held stable for several minutes before a reliable detection of a lightning becomes possible.

In addition, there are now existing rather inexpensive low-end lightning detectors which are completely portable in size and which do not require a specific orientation. These detectors, however, are extremely susceptible to electromagnetic compatibility (EMC) emissions from cars etc. and thus tend to cause spurious alarms especially in an urban setting.

For standard wired phones, it is moreover known from the document U.S. Pat. No. 5,959,815 A1 to detect potentially damaging electrical fields based on a current induced in an extra modem wire.

SUMMARY OF THE INVENTION

It is an object of the invention to provide a reliable lightning detection feature for a mobile RF enabled device.

A mobile RF enabled device is proposed which comprises an electromagnetic interferences detection component detecting electromagnetic interferences in radio-frequency signals received by the mobile RF enabled device for a communication link. The proposed device further comprises a processing component adapted to determine whether a lightning stroke can be assumed to have occurred in the vicinity of the device due to an electromagnetic interference detected by the electromagnetic interferences detection component, and adapted to cause a notification of a user about an assumed occurrence of a lightning stroke via a user interface.

Moreover, a system is proposed, which comprises a network element of some network and the proposed mobile radio-frequency enabled device. The device comprises in addition a radio frequency module enabling at least a one-directional communication with the network element by means of radio-frequency signals. The network can be for example a mobile communication network or a satellite based network like GPS.

Moreover, a method of detecting the presence of a lightning stroke by means of a mobile radio-frequency enabled device is proposed. This method comprises detecting electromagnetic interferences in radio-frequency signals received by the mobile radio-frequency enabled device for a communication link, determining whether a lightning stroke can be assumed to have occurred in the vicinity of the device based on a detected electromagnetic interference, and notifying an assumed occurrence of a lightning stroke to a user via a user interface.

Finally, a software program product is proposed, in which a software code for detecting the occurrence of a lightning stroke in the vicinity of a mobile radio-frequency enabled device is stored. When running in a processing component of the mobile radio-frequency enabled device, the software code determines whether a lightning stroke can be assumed to have occurred in the vicinity of the device based on detected electromagnetic interferences in radio-frequency signals received by the mobile radio-frequency enabled device for a communication link. Further, the software code causes a notification of a user about an assumed occurrence of a lightning stroke via a user interface.

It has to be understood that in this document, the term "radio-frequency signal" is used to describe all electromagnetic signals employed in wireless communications. Moreover, radio-frequency signals received for a communication link include signals which are received as part of an existing communication link, but equally signals which enable the establishment of a communication link. The communication link for which the radio-frequency signals are received can further be a link for a one-directional or a bi-directional communication. Radio-frequency signals for a one-directional communication may also comprise for example broadcast signals received by a multitude of mobile radio-frequency enabled devices without transmission capability, such as radio signals or GPS signals.

The invention proceeds from the consideration that a lightning stroke is a single flash which produces besides a visual signal and a partly audible pressure signal as well a brief but strong electromagnetic pulse extending over a wide variety of wavelengths. The strongest signal of the electromagnetic pulse is the induced electric field caused by the vertical current in the lightning stroke, and this is the parameter that is most commonly measured in large-scale distance-bearing devices. However, due to the complexity of the lightning stroke phenomenon, there are also strong signals in the extremely low frequency (ELF) range of a few hundred Hertz or less, and weaker signals extending up to the Gigahertz range and above. It is a well-known fact that the exact characteristics and time spectra of the electromagnetic interference (EMI) signatures are different in the Megahertz range than in the Kilohertz and the Hertz range due to the slightly different meteorological mechanisms causing them. However, for the purposes of this invention, it is sufficient to note that at all frequencies of interest, a lightning stroke is accompanied by an EMI pulse that can be identified at a distance of many kilometers.

As a result of the EMI pulse, RF signals which are transmitted during a lightning stroke in the vicinity are shortly interfered. The impairment of RF receivers due to an EMI caused by a lightning stroke can be experienced in AM/FM radio, TV or even power supply lines in form of clicks, scratches, loss of sound or picture, noise, etc. Disturbances in RF signals due to a lightning stroke can be sensed at very large distances. Specialized and large-scale lightning detectors are able to detect lightning disturbances, so-called sferics, at a distance of several hundreds of kilometers from a lightning stroke, although these detectors typically operate by measuring the induced electric field rather than interferences in an RF signal as in this invention. Ordinary AM radios are known to suffer from EMI disturbances at distances up to 30 km or more from a lightning stroke, which can even be heard directly in the audio signal as various clicks. At higher frequencies than AM, the signal is typically much weaker due to both atmospheric attenuation and different causation mechanisms, but is nevertheless detectable at large distances.

While in many mobile RF enabled devices electromagnetic interferences in received RF signals are eliminated immediately by filtering, it is proposed in this invention that exactly such electromagnetic interferences in a radio frequency signal received for an existing or a possible communication link are evaluated. If a detected interference seems to be caused by a lightning stroke, a user of the mobile RF enabled device can be alerted. An interference can be assumed to be caused by a lightning stroke for example if it exceeds a predetermined threshold value or if it has a frequency spectrum which is characteristic of a lightning stroke. The lightning detection can be on as long as the RF detection is on.

It is an advantage of the invention that it provides a new security feature that can be implemented in a mobile RF enabled device, for example in a cellular phone. The proposed monitoring of received RF signals allows to create an integrated system utilizing existing architectures, modules and signaling processing or computing possibilities. Almost no additional components and only minimal changes to the RF part of the device are required. The proposed feature can therefore be implemented with low extra costs and only a small extra size. For example, an implementation might be realized that requires essentially no new hardware components compared to the existing devices, resulting in an added cost of a few Euros versus at least tens of Euros in existing products.

While in many cases, the desire to detect lightning strokes in the vicinity may not be large enough to justify the costs and the difficulty of carrying along a dedicated lightning detector, many people might appreciate a low-cost sensing system that is integrated with a device that they are already carrying along in any case, like a mobile phone or an AM/FM radio. The known art does not provide for such an integration of a lightning detection as a new functionality in other existing portable devices.

The detection of EMI disturbances due to a lightning stroke in a received RF signal can be implemented in various components of the device. It can be implemented for instance in an RF receiving antenna or an RF receiver module or elsewhere in the signal-processing path. The disturbances can further be detected based on microphone signals or on fluctuations in the p/n boundary of suitable semiconductors, for instance of a signal amplifier.

Depending on the location of the detection and on the implementation of the device, the detection and evaluation of interferences can be realized exclusively by software and/or by a specific detector circuitry. For example, in direct conversion RF-receivers, which analyze received high frequency RF signals by software, a specific detector circuitry has to be employed to capture the disturbances, since a software based processing alone is not capable of detecting an abnormal behavior of RF signals.

Optionally, the detection of EMI disturbances in an RF signal can be supplemented by measurements from other components of the device which are not used for RF reception, but which respond to quick electromagnetic disturbances caused by a lightning stroke. Such components may optionally respond to just one part of the electromagnetic disturbance, that is, the phenomenon they observe may be electrostatic and/or magnetically induced. Such components may include for instance electromagnetic sensors used for a compass application, infrared transceiver modules (IrDA), electrostatic discharge (ESD) protection filters or a Bluetooth™ receiver. The results of the detection of EMI disturbances in an RF signal and of the supplementary measurements then have to be combined in a suitable manner.

Using multiple sources of data for the identification of a lightning stroke can increase the reliability of a detection.

In contrast to conventional large-scale devices, directionality is not required. As is done in existing low-end portable lightning detectors, the possible motion and approach speed of a thunderstorm can be determined for instance statistically by evaluating the amplitudes of detected relevant EMI disturbances. The intensity and the spectrum characteristics of a detected EMI pulse can also be used for estimating the distance of a lightning stroke. If the amplitude is not provided, alternatively the occurrence frequency of detected lightning strokes can be determined, for instance by determining the number of detected relevant disturbances per minute. It is then possible to estimate with a low but non-zero degree of accuracy whether the thunderstorm is becoming more intense depending on the change in the frequency of the strokes. In this case, the system may be used in particular for providing an initial "quick-response" alarm that should cause the user to make closer observations as soon as a lightning stroke is detected anywhere in the vicinity. This is in effect the typical type of service provided by existing low-cost and small-size lightning detectors. The lowest-end detectors basically do just this, and just beep each time they detect a stroke.

The notification of a user about an assumed lightning stroke can be realized in various ways. The notification can be visual and/or acoustic and/or haptic, like for instance by a vibrating alarm. Moreover, it can be performed in one step or in several steps. For example, a first kind of notification may indicate that a thunderstorm is believed to be in the vicinity, and a second kind of notification may warn a user that a thunderstorm is believed to be approaching and with which speed.

In one embodiment of the invention, the proposed lightning detection is further improved by detecting in addition thunder based on received sound signals in a frequency range which includes at least infrasonic signals, that is, sound signals having a frequency below about 20 Hz and for example down to 1 Hz or even below, and possibly in addition signals in the audible frequency range.

The proposal to detect thunder at least based on infrasound proceeds from the consideration that higher frequencies are attenuated faster in the air than lower frequencies. The detection of audible signals is limited to a distance of a few kilometers, corresponding to a propagation time of approximately 20 seconds, since audible sound is attenuated relatively quickly. Infrasound in contrast, which the human ear cannot hear, can travel significantly larger distances under some circumstances than audible sound. The fast pressure variation caused by a lightning stroke produces a very wideband sound signal and hence beside the audible thunder a very strong infrasound signal, which travels much farther than the audible signal.

It is therefore an advantage of this embodiment, that it allows to detect thunder at a relatively large distance from the location of the lightning stroke, that is much further away than the human ear possibly could.

The detection of thunder can be used in particular to determine the current distance of the mobile RF enabled device to the lightning stroke or to improve the estimation of this distance based on the detected EMI disturbances of received RF signals. This approach proceeds from the well-known fact that the distance of a lightning stroke can be estimated by determining the time difference between the seen lightning stroke and the heard thunder. As a known rule of thumb, this time in seconds can be divided by three in order to obtain the approximate distance in kilometers.

The infrasonic signal can be detected by various sensors, in particular by any sensor which is capable of sensing fast mechanical vibrations or variation of the ambient air pressure produced by the infrasound.

The infrasonic signal can be detected for instance by an accelerometer integrated in the mobile RF enabled device. Such accelerometers are mostly employed in mobile RF enabled devices for haptic applications. Accelerometers typically respond to motions in the range of a few Hz to about 50 Hz, and thus to infrasonic signals. The infrasound can further be detected for instance by a vibrating audio microphone which is adjusted to detect signals below the audible frequency range or by a speaker coil generating small signals which can be detected by electronics. In the latter case, the infrasound may move a speaker membrane and a coil assembly attached to the membrane. The coil assembly comprises the speaker coil, which is normally used for sound production. The movement creates a small current in the coil assembly through electromagnetic induction, which is due to a relative movement between the coil attached to the speaker membrane and a surrounding speaker magnet. By using a specific additional electrical circuitry, this small signal can be detected and used for the detection of infrasound.

The proposed infrasound sensing might be activated or set to its maximum sensitivity only when relevant EMI disturbances have been registered. There is sufficient time for activating the infrasound sensing even if there is a delay due to required computations, since there is typically an interval of a few seconds at least between a lightning stroke and the associated sonic and infrasonic signals. This delay can even be exploited for a further power reduction, as electrical circuits or modules may be powered only when required. Therefore, the power consumption can be kept low at first while only the EMI sensitive detection is active and increases when the infrasound sensing is switched on for a more accurate or reliable thunderstorm detection. In an advantageous embodiment, the analysis of detected EMI disturbances is first used for estimating the distance of a lightning stroke and for determining a range of time within which a corresponding thunder should be detected. For example, if an EMI pulse suggests a distance of 10 km, the infrasound sensor should wait for at least 30 second before starting a sensing and give the highest weight to signals received around 30 seconds. If a detected EMI disturbance suggests that the distance of a lightning stroke is too large to be detected even by infrasound, the infrasound sensor does not have to be turned on at all.

Another embodiment of the invention aims at an additional reduction of the power consumption of the proposed mobile RF enabled device. Just like many other environmental phenomena, the probability of thunderstorms depend strongly on location and time. In the U.S. Mid-West, for example, the probability of tornados is very high in June and very low in December. A lightning alerting function that is active all the time at full power would thus be a waste of energy in December.

It is therefore proposed for this further embodiment that the lightning alerting function of a mobile RF enabled device is calibrated based on the known probabilities of a thunderstorm at a given location and a given time.

The location can be determined automatically by the device, for instance based on the global positioning system (GPS), or be input by the user, for instance in the scope of setting the world time. The time can be the world clock or be known from GPS, etc. The time can be either the time of the year, for instance on a monthly basis, and/or the time of the day, for instance on an hourly basis.

The calibration may comprise switching off the lightning alerting function completely in case of a low risk of a thunderstorm. Alternatively, a threshold for the detection of an EMI pulse in an RF signal and/or the rate of measurements could be reduced in case of a low risk of a thunderstorm. This leads to a direct reduction of the power consumption. Further alternatively, the processing level can be adjusted in a way that most detected EMI pulses are not dealt with in a detailed post-processing in the case of a low risk of a thunderstorm, which leads to a lower power consumption due to a reduced use of the processor. Further alternatively, the calibration may affect only or in addition the user interface, that is, the user may not be notified in times of low risk, or only when a thunderstorm in the vicinity is extremely likely. In the latter case, the system is in a sleep mode most of the time. The determined risk of a thunderstorm can also be used for adjusting the user interface, for instance by changing the size and visibility of an icon on a display which indicates that the lightning detection feature is switched on.

The proposed calibration is best implemented in a device which has logically separate positioning/time modules, measurement module and user interface/display module. The calibration can be implemented in form of an additional module within the device, and for instance in software. Probability parameters which depend on the geographical location and on the time can be stored in a table and/or generated by an algorithm. The probability parameters can be input to the calibration module, which then calculates a risk parameter based on these probabilities and causes a suitable calibration.

It has to be noted that the calibration could also be used in a mobile device having some capability related to any other environmental phenomena besides lightning, as long as there is a statistical correlation between the occurrence of the phenomenon and geographical location and time. The capability could be for instance for a measuring capability or a downloading capability from some network.

In a further embodiment of the invention, the mobile RF enabled device is able to communicate with a mobile communication network and to provide information on an assumed lightning stroke in the vicinity of the device to a network element of this network. Such information may include simply a flag in case of an assumed lightning stroke or detailed measurement data. The network element is thereby able to send warnings to other mobile devices in its vicinity. In addition or alternatively, the network element may also contain a lightning detector itself and send warnings to mobile devices in its vicinity. A mobile communication network might also give access to more professional weather services, which can be used by a users to fetch more accurate data by means of their mobile RF enabled devices after a warning has been given.

All evaluations according to the invention can also be used together with other sensor data to make crude short-term predictions of the weather.

Mobile RF enabled devices in which the invention can be implemented can be for example, though not exclusively, global system for mobile communication (GSM) receivers, code division multiple access (CDMA) receivers, wideband CDMA (WCDMA) receivers, wireless local access network (WLAN) receivers, Bluetooth™ receivers, GPS receivers and/or AM/FM receivers or their variants. The monitored radio-frequency signals can thus include for example, though not exclusively, GSM signals, CDMA signals, WCDMA signals, WLAN signals, Bluetooth™ signals, GPS signals, AM radio signals and/or FM radio signals.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

BRIEF DESCRIPTION OF THE FIGURES

FIG. 3 is a first exemplary set of tables for use in a calibration of the device of FIG. 1;

FIG. 4 is a second exemplary set of tables for use in a calibration of the device of FIG. 1;

FIG. 6 is a further exemplary table for use in the calibration of the device of FIG. 1;

DETAILED DESCRIPTION OF THE INVENTION

Figure 1:
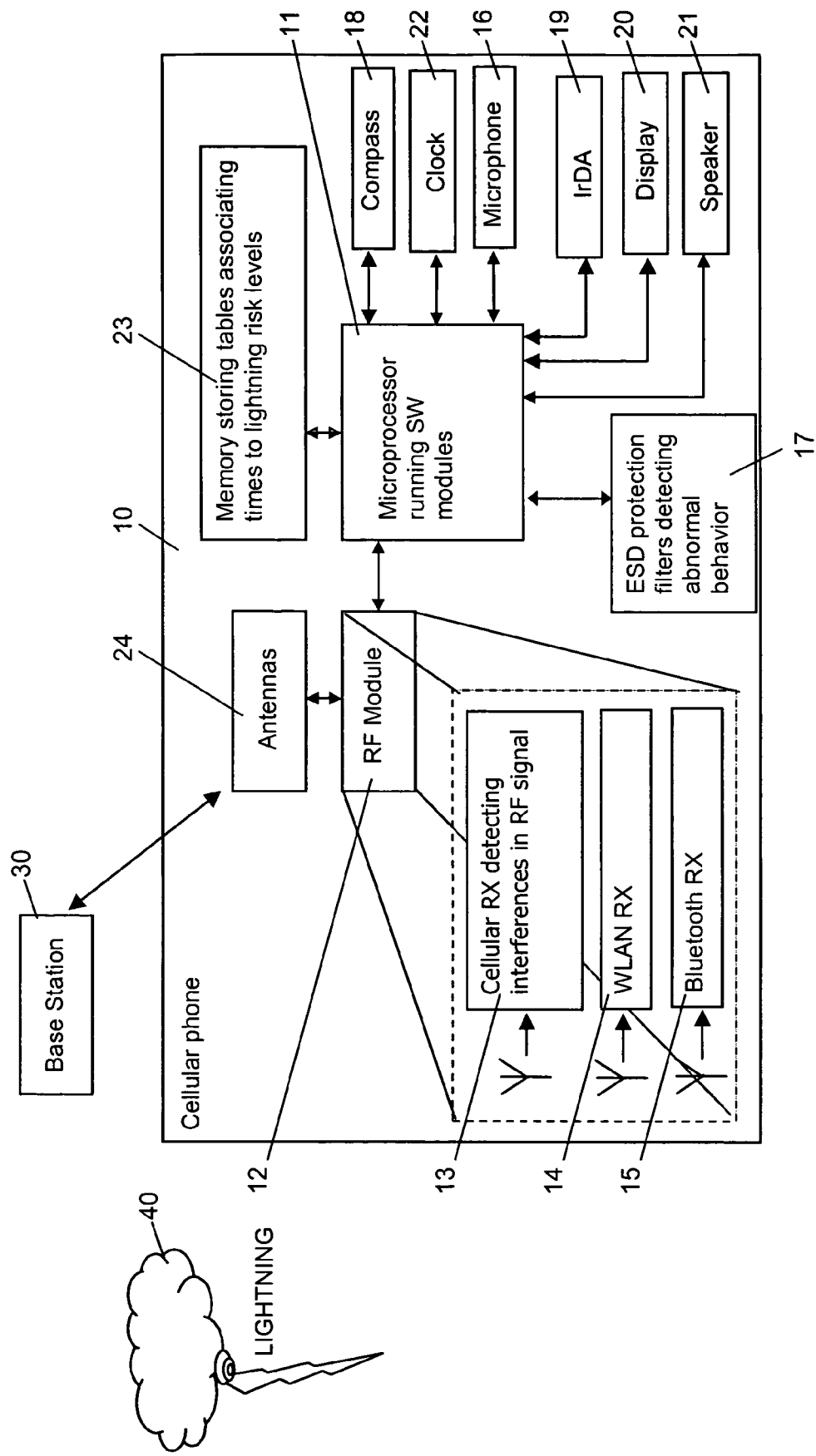
FIG. 1 is a schematic block diagram of a system including a first embodiment of a device according to the invention.

FIG. 1 schematically presents a system in which a lightning detection according to the invention can be implemented.

The system comprises a cellular phone 10 as a mobile RF enabled device and a base station 30 as a network element of a cellular communication network. In addition, the presence of a thunderstorm 40 is indicated.

The cellular phone 10 includes a microprocessor 11 with access to an RF module 12, to a microphone 16, to ESD protection filters 17, to a compass component 18, to an infrared transceiver module IrDA 19, to a display 20, to a speaker 21, to a clock 22 and to a memory 23. The RF module 12 is connected to a plurality of antennas 24 and comprises a component 13 for receiving and transmitting cellular RF signals via a GSM antenna, a component 14 for receiving and transmitting WLAN signals via a WLAN antenna and a component 15 for receiving and transmitting Bluetooth™ signals via a Bluetooth™ antenna. It is understood that the cellular phone 10 may include in addition any further component known from conventional cellular phones.

The depicted base station 30 is the base station to which the cellular phone 10 is currently attached.

Figure 2:
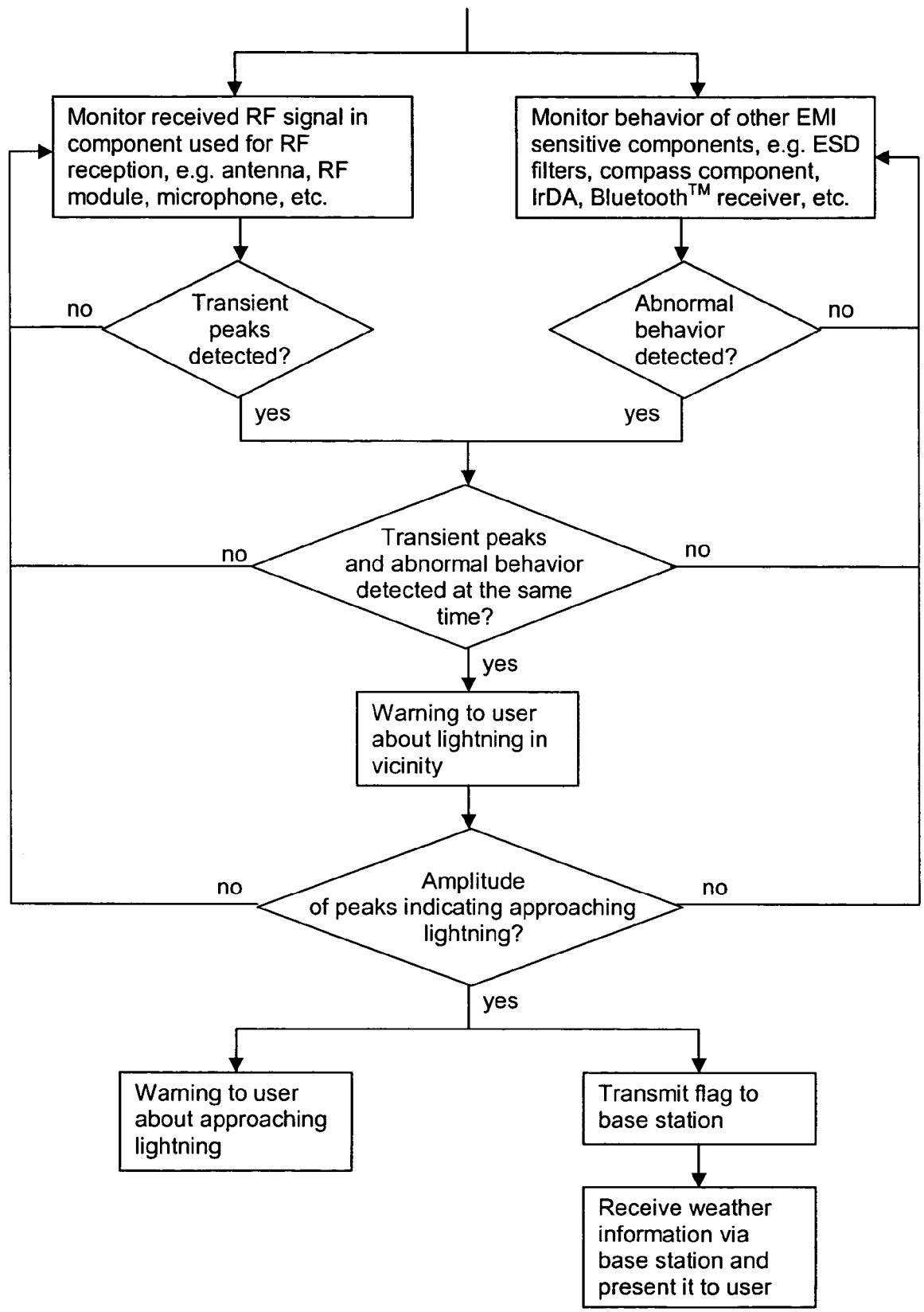
FIG. 2 is a flow chart illustrating the operation of the device of FIG. 1.

The basic operation in the system will now be described with reference to the flow chart of FIG. 2.

A trigger circuitry in the cellular receiver component 13 of the RF module 12 monitors incoming raw RF signals with regard to fast transient peaks, before such peaks are filtered away for a subsequent processing of an undisturbed signal.

The trigger circuitry might identify in particular transient peaks having a lightning-specific signal characteristic. The use of RF-bands is well defined by standardization for basically all types of communication in cellular or other RF transmission systems. Thus, any deviation in a received RF signal from a standard behavior can be detected reliably as electromagnetic interference EMI, which gives a strong hint at the occurrence of a lightning stroke in case the amplitude of a detected EMI pulse is rather high.

If the trigger circuitry identifies a transient peak having a lightning-specific signal characteristic, a corresponding indication including the amplitude of the detected peak is forwarded to the microprocessor 11.

Alternatively, a trigger circuitry for detecting fast transient peaks in the RF signals could be included in any other component receiving such RF signals, for instance in one of the antennas 24, in another one of the receiving components 14, 15, in the microphone 16, or in a semiconductor component (not shown) employed for instance for an amplification of received RF signals. In the latter case, fast transient peaks become apparent from fluctuations in the p/n boundary.

In parallel, at least one other component looks for an abnormal behavior due to an EMI pulse for improving the detection of a lightning stroke occurrence. Such other component can be for instance the ESD protection filters 17, electromagnetic sensors of the compass component 18, the infrared transceiver module 19 or the Bluetooth™ receiver component 15.

In FIG. 1, the ESD protection filters 17, which filter high voltage discharge from external connector pins, are assumed by way of example to monitor their own behavior. In case the ESD protection filters 17 register an abnormal behavior, for instance a fast transient voltage peak exceeding a predetermined threshold and having a lightning-specific characteristic, a corresponding indication is forwarded to the microprocessor 11.

A lightning detection software module run by the microprocessor 11 evaluates the received indications.

If the microprocessor 11 receives at the same time an indication about a possible lightning stroke from the RF module 12 and from the ESD protection filters 17, the microprocessor 11 informs the user of the cellular phone 10 via the display 20 and/or the speaker 21 that a thunderstorm can be assumed to be present in the vicinity.

The microprocessor 11 moreover monitors the amplitude of transient peaks provided by the RF module 12. Each amplitude by itself can be used for roughly determining the distance of the lightning stroke. An increase in the relative amplitude of a sequence of detected transient peaks moreover indicates that the thunderstorm is approaching. If the relative amplitudes are recorded, even a quite reliable estimation of the approach speed can be made, as known from state-of-the-art products. In case increasing relative amplitudes are detected, the microprocessor 11 may thus warn the user of the cellular phone 10 in addition via the display 20 and/or the speaker 21 that a thunderstorm can be assumed to be approaching.

This warning may include information about the current distance of the detected lightning strokes and about the time when the thunderstorm can be expected to reach the location of the cellular phone 10.

If a lightning stroke is detected, the cellular phone 10 transmits in addition a flag to the base station 30, for distribution to other cellular phones in the coverage area of the base station 30.

Upon transmission of such a flag, the cellular phone 10 may receive automatically more accurate data from a professional weather service via the base station 30. This data can then be presented as well to the user via the display 20 and/or the speaker 21.

In order to minimize the power consumption of the cellular phone 10 of FIG. 1, its lightning detection feature can be calibrated, as will be explained in the following with reference to FIGS. 3 to 6.

FIGS. 3 and 4 present two alternative sets of tables which may be stored in the memory 23 for supporting the calibration. Both sets comprises a monthly table and an hourly table indicating for various locations the risk levels for a thunderstorm in a particular month and at a particular time of the day, respectively. The tables are optimized for the particular case of thunderstorms, for which the monthly risk varies over very small areas, while the hourly risk varies over larger areas but is less reliable.

The monthly table of FIG. 3 lists as locations various geographical areas in a respective row, by way of example Florida FL, Texas TX, New Mexico NM and Tennessee TN, and associates to each area in a respective column the risk level for a thunderstorm for each month, that is, for January J to December D. The possible risk levels are "0" representing no risk N, "1" representing a low risk L, "2" representing an appreciable risk A, "3" representing a high risk H, "4" representing a very high risk V and "5" representing an extreme risk E. The hourly table indicates for various larger geographical areas, namely Midwest and Caribbean, and separately for summer and winter the risk level for a thunderstorm for every second hour, namely for midnight "00" to 10 p.m. "22". The possible risk levels are again "0" to "5".

Such an association of risk levels to geographical areas has the advantage that it facilitates an update of the tables. The respectively required row, however, has to be determined by an additional algorithm or table which receives as input the coordinates of the current location of the cellular phone 10 and which provides as output an identification of the correct row.

The tables of FIG. 4, in contrast, are simple mathematical look-up tables sorted by latitude and longitude. The monthly table lists by way of example the geographical locations 090W 30N, 110W 20N, 120W 30N and 130W 30N in a respective row and associates to each location in a respective column the risk level for a thunderstorm for each month, that is, for January J to December D. The possible risk levels are again "0" to "5". The hourly table of FIG. 4 indicates for various lager areas delimited by latitude and longitude, by way of example 090W 30N to 120W 50N and 060W 10N to 100W 30N, separately for summer and winter the risk of a thunderstorm for every second hour, namely for midnight "00" to 10 p.m. "22". The possible risk levels are again "0" to "5".

The tables of FIG. 4 have the advantage that the choice of the respectively required row is a simple matter of interpolation or lookup with no need for other tables. Tables as presented in FIG. 4 are also highly compressible, which allows to save memory space.

Figure 5:
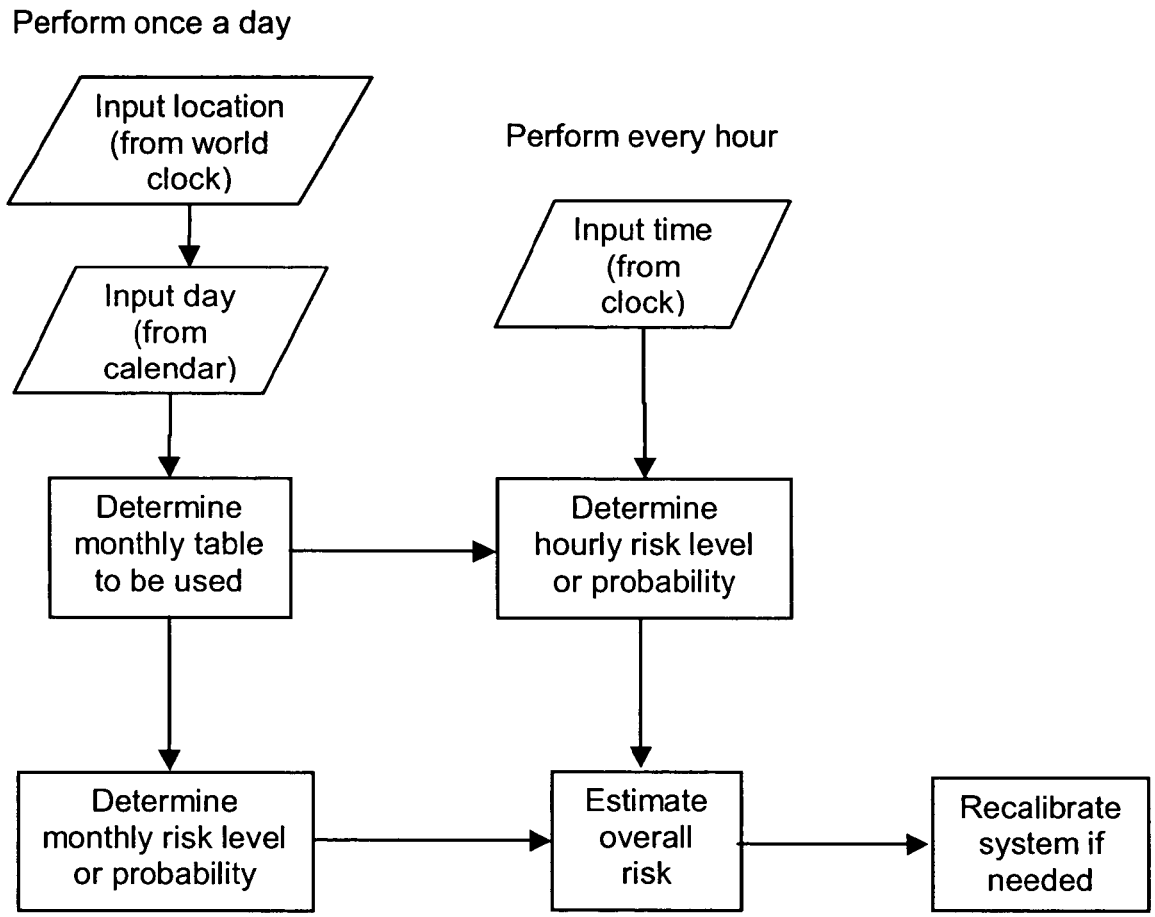
FIG. 5 is a flow chart illustrating the calibration of the device of FIG. 1.

FIG. 5 is a flow chart illustrating the calibration in the cellular phone 10 of FIG. 1 which stores the tables of FIG. 3 or FIG. 4 in its memory 23.

Once a day, a calibration software module run by the microprocessor 11 determines the current location of the cellular phone 10. The location may be determined for example based on a currently used time-adjustment value for the world clock 22. The location may also be stored in the memory 23 from a preceding input by the user, for example for enabling an automatic adjustment of the world clock 22 of the cellular phone 10 to a particular location.

In addition, the calibration software module determines once a day the current month, for instance from the current day provided by a calendar function of the cellular phone 10.

Next, the calibration software module decides based on the determined location which row of the stored monthly table is to be used and based on the determined month which column of the stored monthly table is to be used. The calibration software module then retrieves the indicated risk level in the field identified by the determined row and the determined column from the stored monthly table as monthly risk level. Depending on the further processing, the calibration software may then determine a monthly probability based on the retrieved risk level. To this end, the indicated risk level is divided by 5. For example, a low risk level "1" results in a probability 1/5, a high risk level "3" in a probability 3/5, etc.

Once per hour, the calibration software module determines in addition the current time from the world clock 22. Moreover, it decides based on the location determined for the current day which row of the hourly table is to be used and base on the determined time of the day which column of the hourly table is to be used. The calibration software module then retrieves the risk level indicated in the field identified by the determined row and the determined column as hourly risk level. Further, the calibration software may determine an hourly probability based on the retrieved hourly risk level. To this end, the indicated risk is divided by 5. For example, a low risk level "1" results in a probability 1/5, a high risk level "3" in a probability 3/5, etc.

The calibration software module then estimates a joint risk level or a joint probability for enabling a sensitivity setting.

A joint risk level can be determined by multiplying the determined monthly risk level and the determined hourly risk level, the resulting joint risk levels R lying between 0 and 25. The joint risk levels R can then be associated to a certain overall risk as follows:

R<=1: No risk
1<R<=2: Low risk
2<R<=4: Appreciable risk
4<R<=9: High risk
9<R<=12: Very high risk
R>12: Extreme risk Alternatively, a joint probability could be calculated by multiplying the determined monthly probability and the determined hourly probability. The following rules could then be used for associating a certain overall risk to the resulting joint probability P:

Low risk: P<=1*1/25
Appreciable risk: 1*1/25<P<=2*1/25
High risk: 2*1/25<P<=2*2/25
Very high risk: 2*2/25<P<=3*3/25
Extreme risk: P>3*4/25

By way of example, it could be assumed that the cellular phone is located in Florida at noon in April. From the monthly table, it can be determined that the probability of a lightning stroke in April is 2/5 or 40%. From the hourly table, it can be determined that the probability of a lightning stroke at noon is 4/5 or 80%. The joint probability is then 2*4/25 or 32%. With the above definitions, this corresponds to an overall "high risk".

Determining the overall risk by simply multiplying the monthly and hourly risk levels or probabilities, respectively, has the disadvantage that it does not allow to take account of extreme differences in the monthly and hourly risk levels or probabilities and of the different reliabilities of the monthly and the hourly risk levels. For example, the determined monthly risk level might be extremely high but the determined hourly risk level, which is less reliable, very low.

In a further alternative, which is assumed to be implemented in the cellular phone 10 of FIG. 1, this problem is solved by defining the overall risk with a so-called fuzzy methodology. More specifically, an overall risk is assigned freely to any possible combination of a monthly risk and an hourly risk. FIG. 6 presents a table where the possible monthly risks N, L, A, H, V and E are associated to different rows, where the possible hourly risks N, L, A, H, V and E are associated to different columns, and where each field in the table assigns a specific overall risk to the corresponding combination of a specific monthly risk and a specific hourly risk. With such an approach, it is for instance possible to assign to a situation with no risk N for a certain month but an extremely high risk E for a certain hour only an appreciable overall risk A, while assigning to a situation with no risk N for a certain hour but an extremely high risk E for a certain month nevertheless a very high overall risk V.

If the overall risk estimated based on the table of FIG. 6 deviates from the overall risk determined one hour ago, the calibration software module re-calibrates the lightning alerting functions of the cellular phone accordingly.

The overall risk can be used for instance for calibrating the environmental sensors themselves. For example, the detection threshold in the RF module 12 for detecting transient peaks can be set higher and/or the sampling rate used by the RF module 12 for detecting transient peaks be set lower with a lower overall risk than with a higher overall risk. Such an adjustment leads directly to a lower power consumption when the overall risk is low. Other sensors, like the ESD protection filters 17, etc. could be calibrated accordingly. Alternatively, the processing level may be adjusted so that in case of a low risk, most detected peaks are not indicated by the RF module 12 etc. to the microprocessor 11 for a more detailed post-processing. This leads to a lower power consumption since the microprocessor 11 is used less.

The calibration may moreover affect the warning of a user in a way that in times of a low overall risk, warnings are only given when the presence of a thunderstorm is extremely likely. Thereby, the lightning detection feature of the cellular phone 10 is in a sleep or low-power idle mode most of the time.

Figure 7:
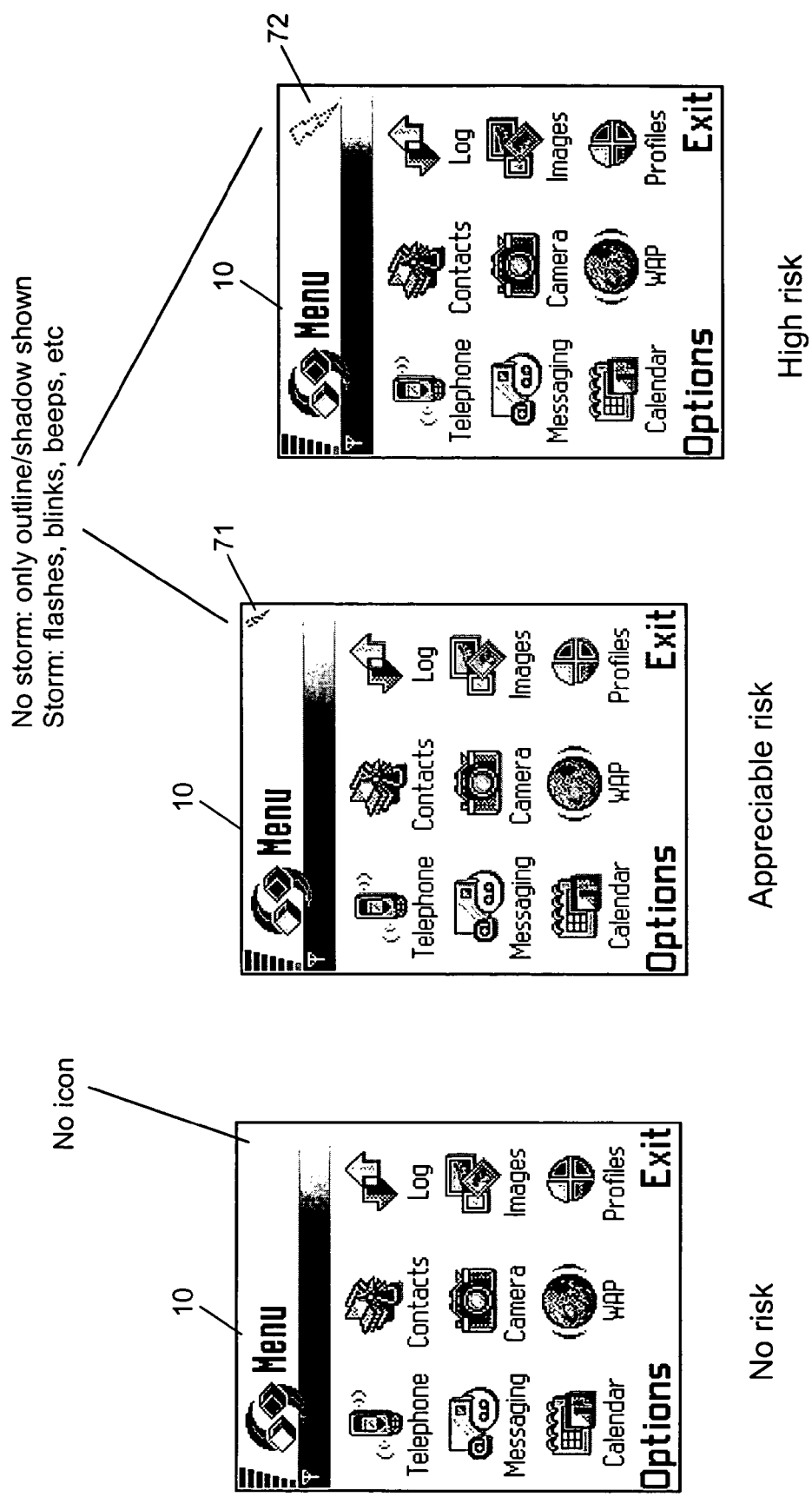
FIG. 7 illustrates a possible adjustment of a user interface of the device of FIG. 1 as part of a calibration of the device.

Further, the calibration may include adjusting the user interface as presented by way of example in FIG. 7. FIG. 7 presents the display 20 of the cellular phone 10 in three situations. In times of a very low overall risk, a standard icon indicating that the lightning detection feature is active is switched off completely. For this situation, the display 20 is presented on the left hand side of FIG. 7. In times of a moderate overall risk, the icon 71 is displayed with a small size all of the time. For this situation, the display 20 is presented in the middle of FIG. 7. In times of a high overall risk, the icon 72 is prominently displayed all of the time. For this situation, the display 20 is presented on the right hand side of FIG. 7. This adjustment helps to avoid cluttering the screen of the cellular phone 10 in times of a low overall risk, while making sure that the warning is seen clearly when the overall risk is high. In the latter two situations, the displayed icon 71, 72 starts flashing or blinking in case of a detected lightning stroke. In addition or alternatively, a beeping or the like could be output via the speaker 21.

Moreover, the determined overall risk can be used to optimize and adjust downloads of data via the base station 30 when network-based services are used, for instance downloads of weather forecasts or real-time maps of lightning locations. During periods of a high overall risk, downloads can be carried out at quick intervals. When the overall risk is low, in contrast, the downloading can be carried out more rarely or not at all. It is to be understood that in practice, the cellular phone 10 should ask the user whether a downloading is actually desired, in order to save both bandwidth and cost to the user.

It is an advantage of the presented calibrations that they enable considerable savings of power and user costs, especially if some features can be switched off completely in times of a low overall risk. Further, the usability and the convenience of the calibrations is very good and the user interface can be made clearer to some extent. Also the implementation is relatively simple and can be realized in a modular way.

The calibration can be used in conjunction with an existing world clock application. Nevertheless, the employed tables can be added and modified as modules without requiring changes to the calendar, the clock, or the sensor software, as the calibration can be realized as an add-on functionality. The calibration is further not dependent on any network provider service, since the tables are kept within the cellular phone itself. However, it is of course possible for a network provider to provide an augmented or improved service by allowing higher-quality or higher-resolution data to be downloaded. The memory space required for the calibration could be decreased if the location list values are omitted in the stored tables and if an algorithm is used instead for finding the respective location. In this case, also no update of the tables is needed when a new location is defined.

A second embodiment of a lightning detection according to the invention will now be described with reference to FIGS. 8 to 11. The lightning detection is implemented again in a cellular phone as a mobile RF enabled device. In this embodiment, the cellular phone 90 may comprise all features and functions of the cellular phone 10 of FIG. 1, but it evaluates in addition to the electromagnetic interferences also at least infrasonic sound signals caused by variations in air pressure. This feature enables an improve determination of the distance of a detected lightning stroke to the cellular phone 90.

While the second embodiment may allow the detection and evaluation of audible signals above about 20 Hz in addition to the detection and evaluation of true infrasound signals below about 20 Hz, the real added value in this embodiment originates from the detection and evaluation of sound signals that the user is not able to detect on his own, which is not known from the state of the art.

Figure 8:
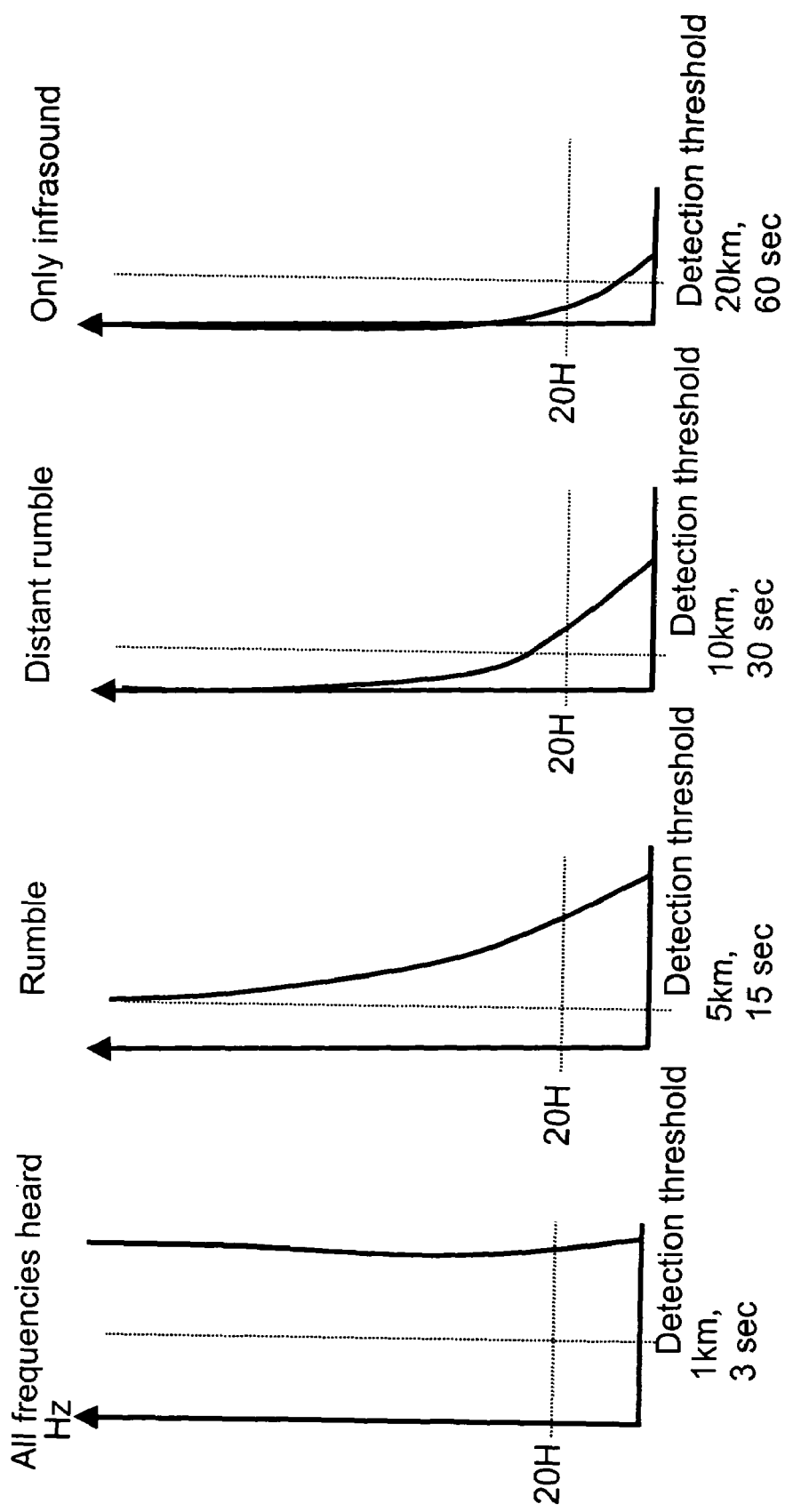
FIG. 8 presents diagrams illustrating the audible sound and infrasound frequency spectrum over distance.

FIG. 8 presents four theoretical diagrams depicting the audible sound and infrasound frequency spectrum versus the distance of a lightning stroke. The diagrams illustrate differences in the detectable range of different sound frequencies at the location of a cellular phone.

All audible sound and infrasound frequencies of a signal can be detected at a distance of 1 km to the source of the signal, which corresponds to a traveling time of the signal of approximately 3 seconds. This is illustrated in the first diagram of FIG. 8. A clear rumbling can be detected at a distance of 5 km to the source of the signal, which corresponds to a traveling time of the signal of approximately 15 seconds. This is illustrated in the second diagram of FIG. 8. A distant rumbling can be detected at a distance of 10 km to the source of the signal, which corresponds to a traveling time of the signal of approximately 30 seconds. This is illustrated in the third diagram of FIG. 8. Only infrasound signals can be detected, however, at a distance of 20 km to the source of the signal, which corresponds to a traveling time of the signal of approximately 60 seconds. This is illustrated in the fourth diagram of FIG. 8.

Figure 9:
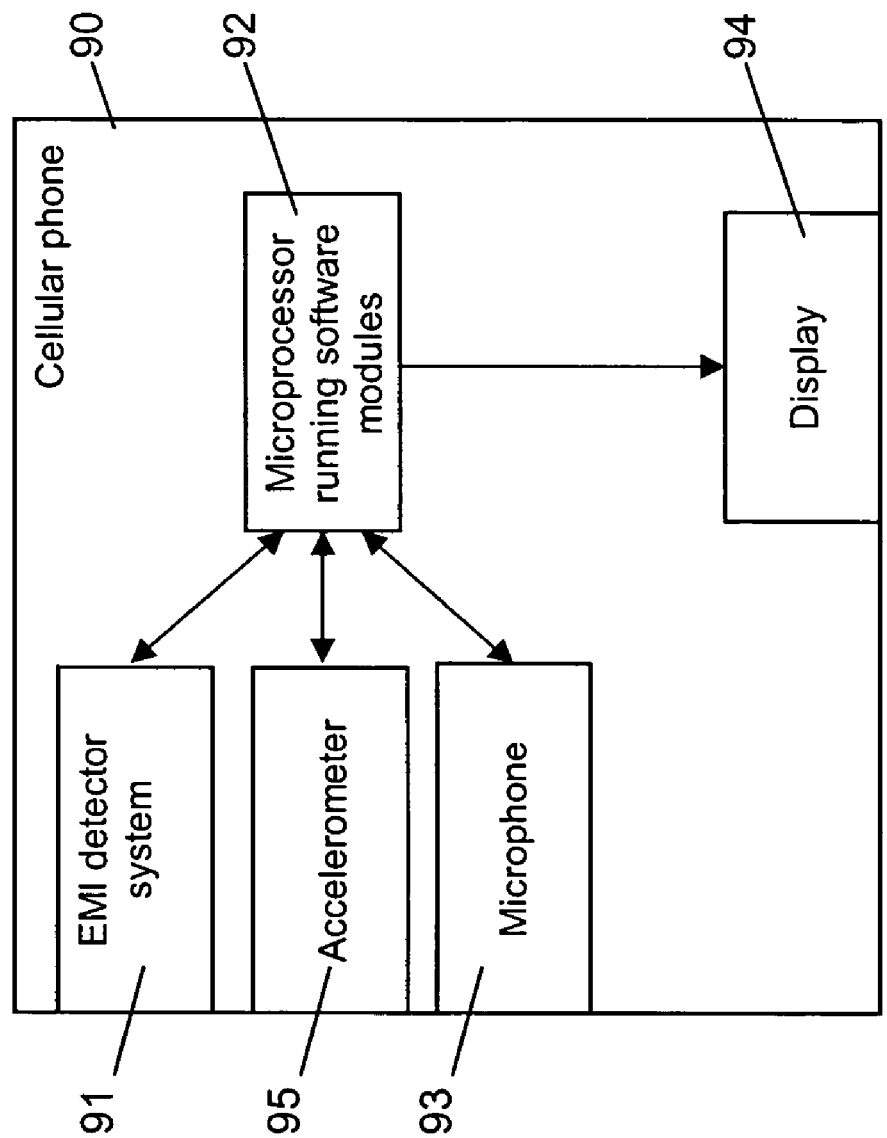
FIG. 9 is a schematic block diagram of a second embodiment of a device according to the invention.

FIG. 9 is a schematic block diagram of the cellular phone 90 according to the second embodiment of the invention.

The cellular phone 90 comprises components which enable a lightning detection as described with reference to FIG. 1. These components are summarized in FIG. 9 as a block EMI detector system 91, except for the microprocessor 92, the microphone 93 and the display 94, which are shown separately. Moreover, the cellular phone comprises an accelerometer 95. The microprocessor 92 has access to the EMI detector system 91, to the accelerometer 95, to the microphone 93 and to the display 94.

Figure 10:
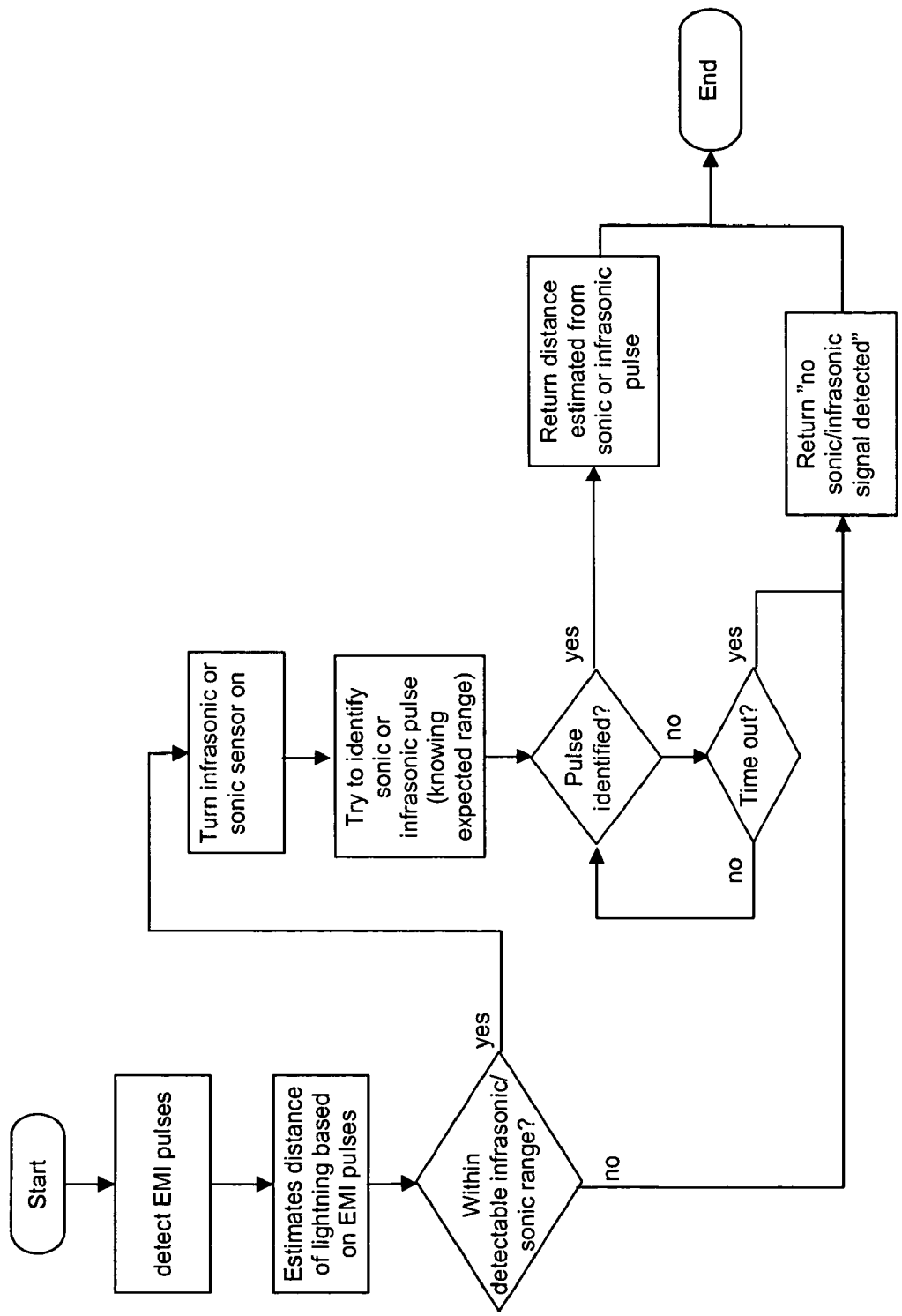
FIG. 10 is a flow chart illustrating the operation of the device of FIG. 9.

The flow chart of FIG. 10 illustrates operation of the cellular phone of FIG. 9.

The EMI detector system 91 is switched on as long as the overall risk of a lightning stroke is not low. When the EMI detector system 91 detects EMI pulses characteristic of a lightning stroke, for instance by means of the RF module 12 of FIG. 1, a lightning detection software module run by the microprocessor 92 estimates the distance of an assumed lightning stroke based on the amplitudes of the detected EMI pulses as described above with reference to FIGS. 1 and 2.

In case the lightning stroke can be assumed to be in a range allowing a detection of infrasonic signals, a sound detection software module run by the microprocessor 92 turns on the accelerometer 95 as an infrasonic sensor. In case the lightning stroke can be assumed to be even in a range allowing a detection of sound signals, the sound detection software module moreover turns on the microphone 92 as audio sensor.

The accelerometer 95 and possibly the microphone 93 then try to identify infrasonic and sonic pulses, respectively, within a time range after a detected lightning stroke which corresponds to the estimated distance of the lightning stroke. The detected signals are evaluated by the sound detection software module of the microprocessor 92.

Figure 11:
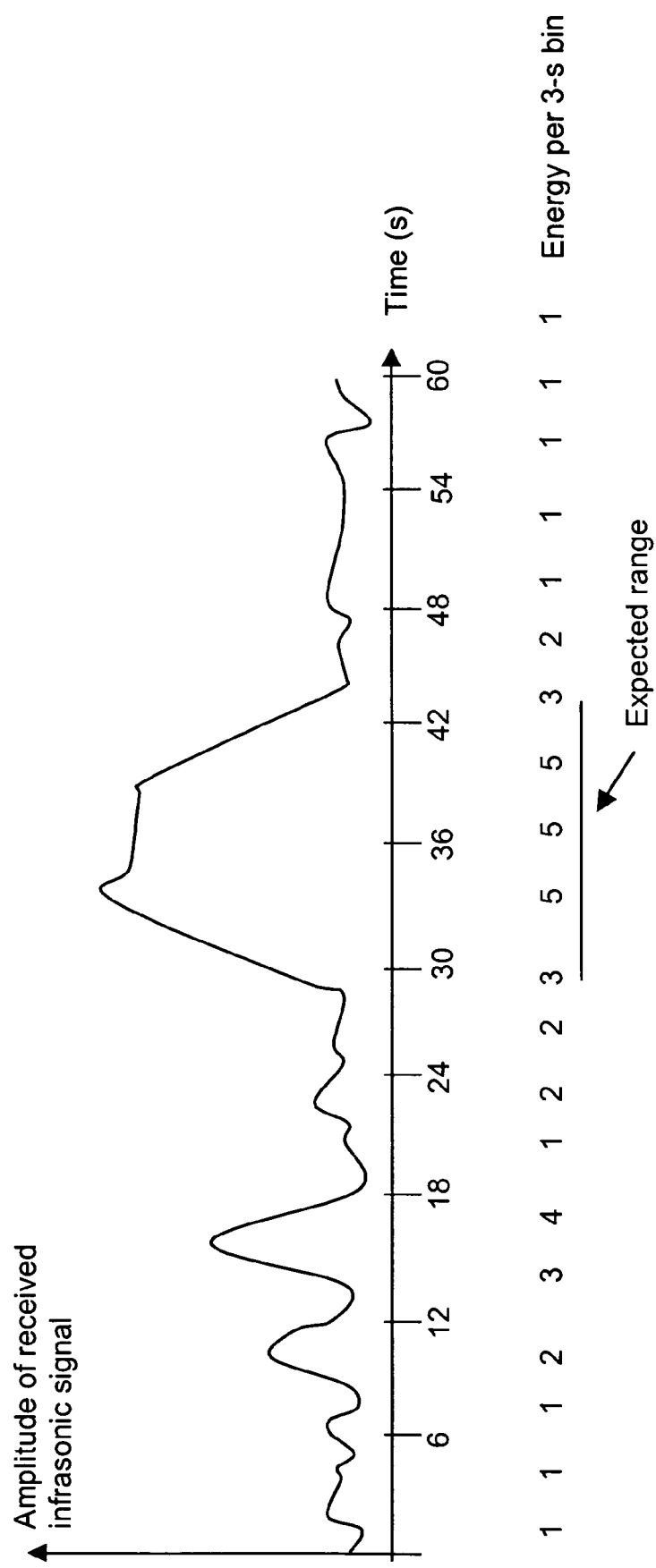
FIG. 11 is a diagram illustrating the detection of a correct infrasound pulse in the device of FIG. 9.

FIG. 11 is a theoretical diagram depicting the amplitude of infrasonic signals detected by the accelerometer 95 over a time of 60 seconds in an exemplary situation. In addition, a normalized energy value for a respective 3-second-bin is indicated below the time scale. Based on indications by the EMI detection system 91, the microprocessor 92 is assumed to have estimated a lightning stroke to be currently at a distance of about 12 km±3 km. This corresponds for infrasonic signals to a time delay versus the detection of the lightning stroke of about 36 s±9 s. This range is equally indicated in FIG. 11.

It can be seen in FIG. 11 that there is a peak at about 15 s, which could be misidentified by the microprocessor 92 as a peak caused by the detected lightning stroke. However, with the knowledge that the distance of the lightning stroke should be close to 12 km, the microprocessor 92 is able to select the peak starting around 27 s as the peak which is more likely to be the correct peak. It has to be noted that this method is statistical, and therefore a reliability estimate should be included.

Using the peak analysis of the time series thus allows to eliminate some of the spurious noise from the detected infrasonic signals. Such spurious noise is a key problem especially in an urban environment which contains numerous sources of infrasound noise, such as cars, trams, etc. An urban environment also contains sources of spurious EMI pulses, and traditional low-end lightning detectors in fact tend to perform very poorly in an urban environment causing spurious alarms. Performance in an urban environment can be improved by statistical methods, and using the EMI pulse and infrasound signal simultaneously as described here can add further robustness to the statistical analysis.

As in the example of FIG. 11, an infrasonic pulse is seen in the expected time range starting at t=27 s, which corresponds to a distance of 9 km, it can be assumed by the microprocessor 92 that the real distance is closer to 9 km than to 15 km.

In case the microphone 93 is switched on as well and provides detected sonic signals to the sound detection software module of the microprocessor 92, these signals are evaluated accordingly.

The allowed time range for an infrasonic or sonic pulse indicated by the lightning detection software module is used by the sound detection software module for setting a timeout value. If the monitoring of received infrasonic and sonic signals does not result in the detection of an infrasonic or sonic pulse before a timeout occurs, a flag is returned which indicates that no infrasonic or sonic signal was detected.

If the monitoring of received infrasonic or sonic signals results in the detection of an infrasonic or sonic pulse in the time range indicated by the lightning detection software module, the beginning of this pulse constitutes an additional estimate for the distance of the lightning stroke.

The distance estimate based on detected infrasonic or sonic pulses can be incorporated with the distance estimate based on EMI pulses. The final distance can be for instance a weighted average of the two distances. Alternatively, the estimate based on detected infrasonic or sonic pulses can be used as boundary value for the estimate based on EMI pulses. It would even be possible to use the estimate which is based on detected infrasonic or sonic pulses as the primary value for the distance.

Since it is usually only of importance for a user to know the distance of a lightning stroke to the closest kilometer, even fairly large errors of several seconds are acceptable in the detection of infrasonic or sonic pulses. This means that the bandwidth and other requirements do no need to be very tight, resulting in power savings.

The implementation of the second embodiment of the invention increases the reliability of the determined distance with no extra hardware, since a microphone is always included in a cellular phone, and accelerometers are becoming increasingly common as well. The presented embodiment operates at the natural frequency range of accelerometers, that is, a few Hz to 50 Hz, so no fine tuning of the employed accelerometers is needed. Since the infrasound sensing is only triggered when an EMI pulse has been detected, the power consumption increases only slightly compared to the first embodiment. An early detection of EMI pulses and a reliability increase by means of an infrasound analysis even enables power savings while monitoring thunderstorms, if no sound analysis is running.

While there have been shown and described and pointed out fundamental novel features of the invention as applied to a preferred embodiment thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A mobile radio-frequency enabled device comprising:
   an electromagnetic interferences detection component detecting electromagnetic interferences in radio-frequency signals received by said mobile radio-frequency enabled device for a communication link; and
   a processing component adapted to determine whether a lightning stroke can be assumed to have occurred in the vicinity of said mobile radio-frequency enabled device due to an electromagnetic interference detected by said electromagnetic interferences detection component, and adapted to cause a notification of a user about an assumed lightning stroke via a user interface.

2. A mobile radio-frequency enabled device according to claim 1, further comprising an additional interferences detection component for detecting at least one of electrostatic and magnetic interferences in at least one component of said mobile radio-frequency enabled device, which component is sensitive to at least one of electrostatic and magnetic interferences and which component is not employed for receiving or processing radio frequency signals, wherein said processing component assumes an occurrence of a lightning stroke if interferences are detected at the same time by said electromagnetic interferences detection component as by said additional interferences detection component.

3. A mobile radio-frequency enabled device according to claim 1, wherein said processing component is further adapted to estimate a distance of an assumed lightning stroke based on at least one of an amplitude, an intensity and spectrum characteristics of a detected electromagnetic interference.

4. A mobile radio-frequency enabled device according to claim 1, wherein said processing component is further adapted to estimate the direction of a movement of a thunderstorm based on at least one of a change of intensity in detected electromagnetic interferences and a change of an occurrence frequency of detected electromagnetic interferences.

5. A mobile radio-frequency enabled device according to claim 1, wherein said processing component is further adapted to estimate the speed of a movement of a thunderstorm based on an amplitude of a detected electromagnetic interference.

6. A mobile radio-frequency enabled device according to claim 1, further comprising a sound detection component for detecting signals indicative of thunder in a frequency range including at least frequencies of infrasonic signals.

7. A mobile radio-frequency enabled device according to claim 6, wherein said sound detection component comprises an accelerometer for detecting infrasonic signals.

8. A mobile radio-frequency enabled device according to claim 6, wherein said processing component is further adapted to estimate a distance of an assumed lightning stroke to said mobile radio-frequency enabled device based on the time of detection of electromagnetic interferences detected by said electromagnetic interferences detection component and on the time of detection of infrasonic signals detected by said sound detection component.

9. A mobile radio-frequency enabled device according to claim 6, wherein said sound detection component is activated only when said electromagnetic interferences detection component has detected an electromagnetic interference due to which said processing component assumes the presence of a lightning stroke.

10. A mobile radio-frequency enabled device according to claim 1, further comprising a calibration component which is arranged to calibrate said mobile radio-frequency enabled device based on known probabilities of a thunderstorm at a given location and a given time.

11. A mobile radio-frequency enabled device according to claim 10, wherein said time is at least one of a time of the year and a time of the day.

12. A mobile radio-frequency enabled device according to claim 10, wherein said calibrating component calibrates said device by at least one of switching an electromagnetic interferences detection component on or off, adjusting a measurement rate employed by an electromagnetic interferences detection component for detecting electromagnetic interferences, adjusting a threshold value employed by an electromagnetic interferences detection component for detecting electromagnetic interferences, allowing or preventing a processing of data on detected electromagnetic interferences, allowing or preventing a notification of a user about an assumed presence of a lightning stroke, and adjusting a user interface.

13. A mobile radio-frequency enabled device according to claim 1, further comprising a radio frequency module adapted to enable a communication with a mobile communication network, wherein said processing component is further adapted to cause said communication component to transmit a corresponding indication to said mobile communication network in case said processing component assumes the presence of a lightning stroke.

14. A system comprising a network element of a network and a mobile radio-frequency enabled device, said mobile radio-frequency enabled device including:
   a radio frequency module enabling a communication with said network element by means of radio-frequency signals;
   an electromagnetic interferences detection component detecting electromagnetic interferences in radio-frequency signals received by said mobile radio-frequency enabled device for a communication link; and
   a processing component adapted to determine whether lightning stroke can be assumed to have occurred in the vicinity of said mobile radio-frequency enabled device due to an electromagnetic interference detected by said electromagnetic interferences detection component, and adapted to cause a notification of a user about an assumed lightning stroke via a user interface.

15. A method of detecting the presence of a lightning stroke by means of a mobile radio-frequency enabled device, said method comprising:
   detecting electromagnetic interferences in radio-frequency signals received by said mobile radio-frequency enabled device for a communication link;
   determining whether a lightning stroke can be assumed to have occurred in the vicinity of said mobile radio-frequency enabled device based on a detected electromagnetic interference; and
   notifying an assumed lightning stroke to a user via a user interface.

16. The method according to claim 15, further comprising:
   detecting at least one of electrostatic and magnetic interferences in at least one component of said mobile radio-frequency enabled device, which at least one component is sensitive to at least one of electrostatic and magnetic interferences and which at least one component is not employed for receiving or processing radio-frequency signals;
   wherein a lightning stroke is only assumed to have occurred if electromagnetic interferences in received radio-frequency signals are detected at the same time as electrostatic or magnetic interferences in said at least one component.

17. The method according to claim 15, further comprising detecting sound signals indicative of thunder in a frequency range including at least frequencies of infrasonic signals.

18. The method according to claim 15, comprising a preceding step of calibrating said mobile radio-frequency enabled device based on known probabilities of a thunderstorm at a given location and a given time.

19. A computer program product in which a software code is stored on a readable medium, the software code for detecting the presence of a lightning stroke in the vicinity of a mobile radio-frequency enabled device, said software code realizing the following steps when running in a processing component of said mobile radio-frequency enabled device:
   determining whether a lightning stroke can be assumed to have occurred in the vicinity of said mobile radio-frequency enabled device based on detected electromagnetic interferences in radio-frequency signals received by said mobile radio-frequency enabled device for a communication link; and
   causing a notification of a user about an assumed lightning stroke via a user interface.

20. A computer program product according to claim 19, wherein said software code when running on said processing component assumes a lightning stroke to have occurred only in case said electromagnetic interferences in received radio-frequency signals are detected at the same time as at least one of electrostatic and magnetic interferences in at least one component of said mobile radio-frequency enabled device, which at least one component is sensitive to at least one of electrostatic and magnetic interferences and which at least one component is not employed for receiving or processing radio-frequency signals.

21. A computer program product according to claim 19, wherein said software code when running on said processing component further realizes the step of determining whether signals detected in a frequency range including at least frequencies of infrasonic signals are indicative of thunder.

22. A computer program product according to claim 19, wherein said software code when running on said processing component further realizes the step of calibrating said mobile radio-frequency enabled device based on known probabilities of a thunderstorm at a given location and a given time.

* * * * *